United States Patent
Dewey et al.

(10) Patent No.: US 11,049,773 B2
(45) Date of Patent: Jun. 29, 2021

(54) ART TRENCH SPACERS TO ENABLE FIN RELEASE FOR NON-LATTICE MATCHED CHANNELS

(71) Applicant: Intel Corporation, Santa Clara, CA (US)

(72) Inventors: Gilbert Dewey, Beaverton, OR (US); Matthew V. Metz, Portland, OR (US); Sean T. Ma, Portland, OR (US); Cheng-Ying Huang, Portland, OR (US); Tahir Ghani, Portland, OR (US); Anand S. Murthy, Portland, OR (US); Harold W. Kennel, Portland, OR (US); Nicholas G. Minutillo, Hillsboro, OR (US); Jack T. Kavalieros, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 16/320,425

(22) PCT Filed: Sep. 30, 2016

(86) PCT No.: PCT/US2016/055028
§ 371 (c)(1),
(2) Date: Jan. 24, 2019

(87) PCT Pub. No.: WO2018/063403
PCT Pub. Date: Apr. 5, 2018

(65) Prior Publication Data
US 2019/0267289 A1    Aug. 29, 2019

(51) Int. Cl.
*H01L 29/06* (2006.01)
*H01L 21/8234* (2006.01)
(Continued)

(52) U.S. Cl.
CPC .. *H01L 21/823412* (2013.01); *H01L 21/8234* (2013.01); *H01L 21/823431* (2013.01);
(Continued)

(58) Field of Classification Search
CPC ............. H01L 29/0649; H01L 29/0673; H01L 29/42392; H01L 29/66795; H01L 29/785
See application file for complete search history.

(56) References Cited

U.S. PATENT DOCUMENTS

| 7,923,782 B2* | 4/2011 | Zhu | H01L 29/0653 |
|---|---|---|---|
| | | | 257/349 |
| 8,492,235 B2* | 7/2013 | Toh | H01L 29/41783 |
| | | | 438/300 |

(Continued)

OTHER PUBLICATIONS

International Search Report and Written Opinion for International Patent Application No. PCT/US2016/055028 dated Jun. 23, 2017, 10 pgs.

(Continued)

*Primary Examiner* — Mark V Prenty
(74) *Attorney, Agent, or Firm* — Schwabe, Williamson & Wyatt, P.C.

(57) ABSTRACT

A transistor device comprising a channel disposed on a substrate between a source and a drain, a gate electrode disposed on the channel, wherein the channel comprises a channel material that is separated from a body of the same material on a substrate. A method comprising forming a trench in a dielectric layer on an integrated circuit substrate, the trench comprising dimensions for a transistor body including a width; depositing a spacer layer in a portion of the trench, the spacer layer narrowing the width of the trench; forming a channel material in the trench through the spacer layer; recessing the dielectric layer to define a first portion of the channel material exposed and a second portion (Continued)

of the channel material in the trench; and separating the first portion of the channel material from the second portion of the channel material.

13 Claims, 12 Drawing Sheets

(51) Int. Cl.
H01L 27/088 (2006.01)
H01L 29/66 (2006.01)
H01L 29/78 (2006.01)

(52) U.S. Cl.
CPC ...... *H01L 27/0886* (2013.01); *H01L 29/0638* (2013.01); *H01L 29/66* (2013.01); *H01L 29/6681* (2013.01); *H01L 29/66545* (2013.01); *H01L 29/66795* (2013.01); *H01L 29/7851* (2013.01)

(56) References Cited

U.S. PATENT DOCUMENTS

| | | | |
|---|---|---|---|
| 9,153,657 B2* | 10/2015 | Chen | H01L 29/7855 |
| 10,002,926 B2* | 6/2018 | Cheng | H01L 21/823431 |
| 10,170,609 B2* | 1/2019 | Cheng | H01L 29/0649 |
| 10,418,487 B2* | 9/2019 | Rachmady | H01L 29/7851 |
| 2006/0172497 A1 | 8/2006 | Hareland et al. | |
| 2013/0196485 A1 | 8/2013 | Licausi et al. | |
| 2015/0115216 A1 | 4/2015 | Glass et al. | |
| 2015/0162403 A1 | 6/2015 | Oxland | |
| 2015/0349059 A1 | 12/2015 | Vellianitis | |

OTHER PUBLICATIONS

International Preliminary Report on Patentability for International Patent Application No. PCT/US2016/055028 dated Apr. 11, 2019, 7 pgs.

* cited by examiner

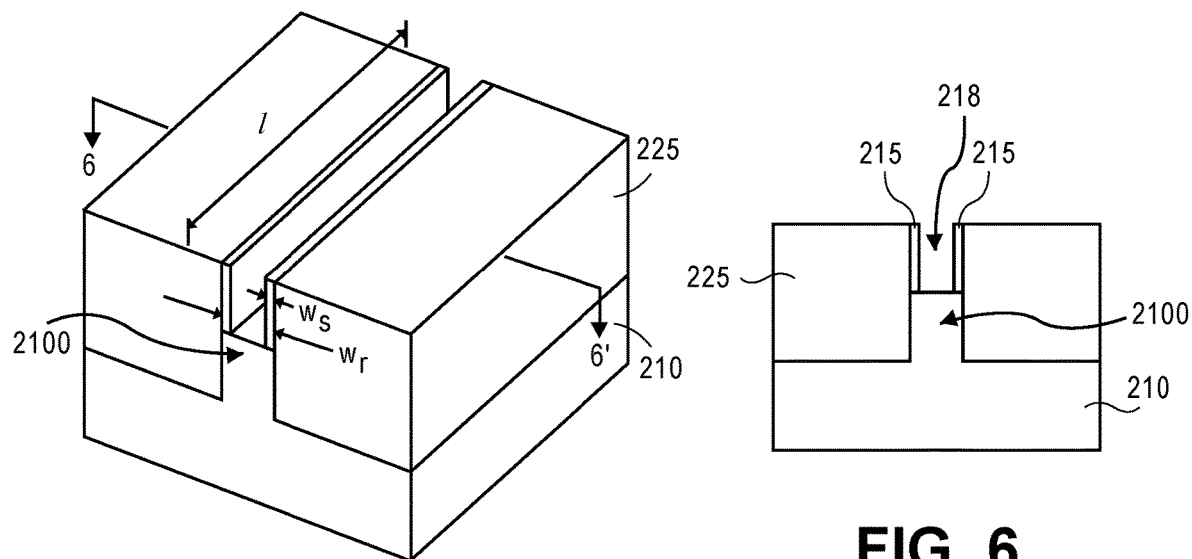
FIG. 5
FIG. 6
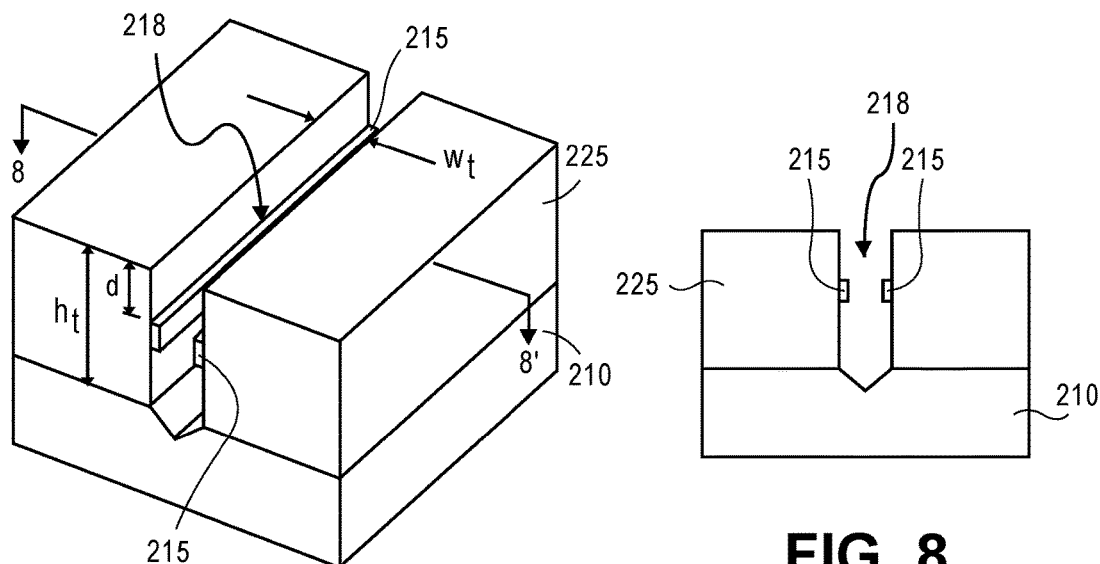
FIG. 7
FIG. 8

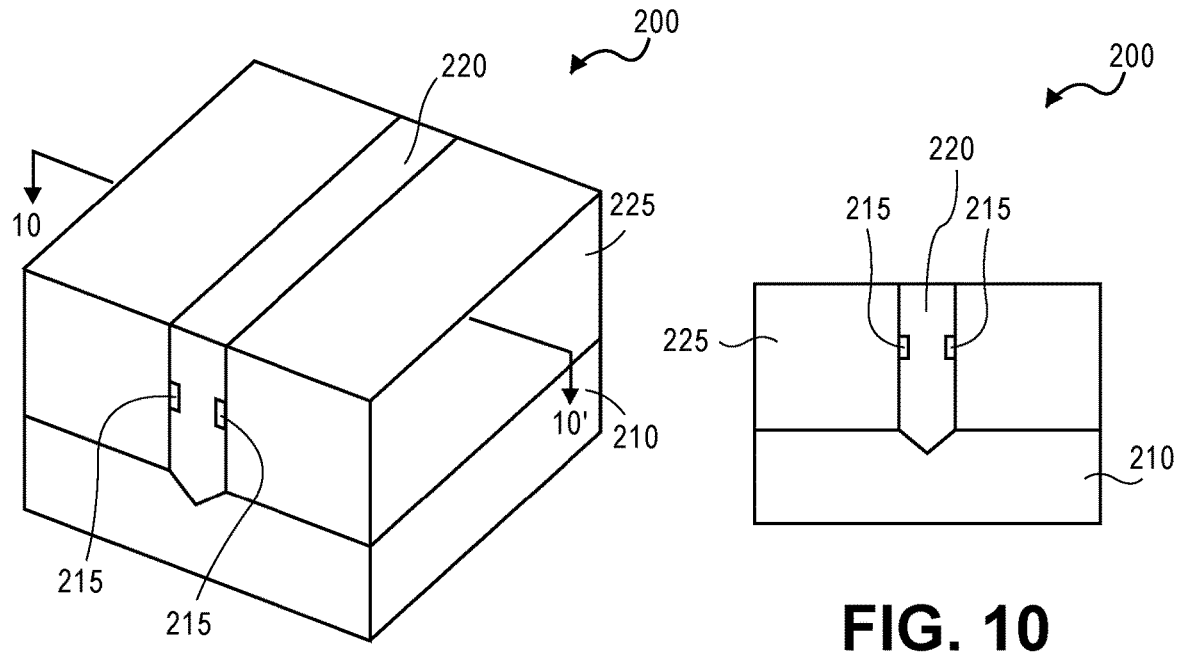
FIG. 9
FIG. 10
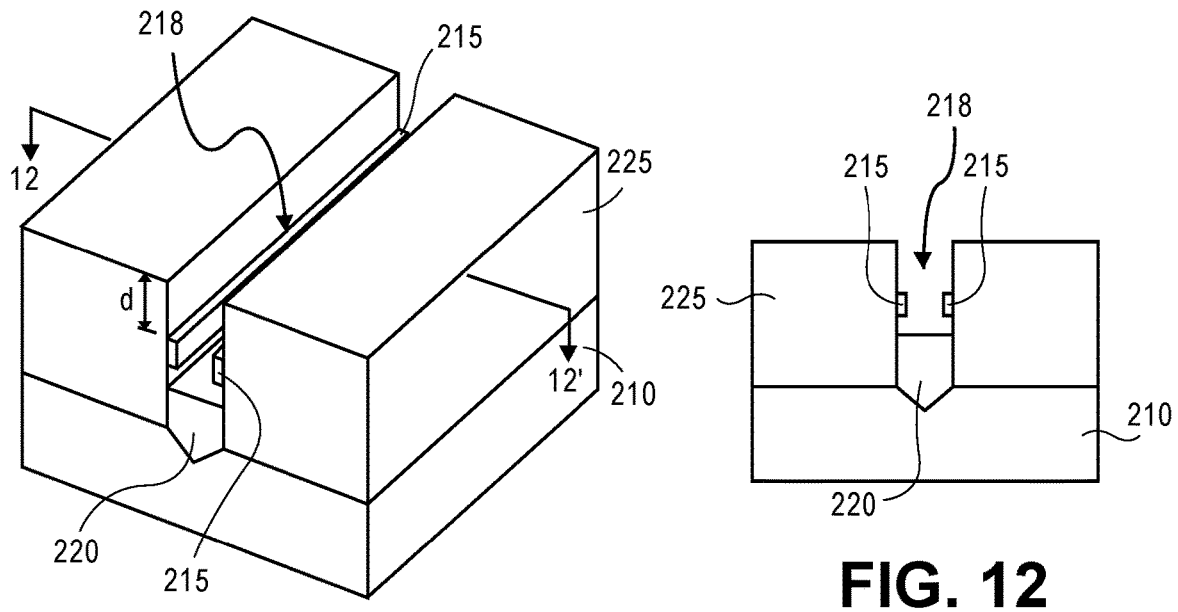
FIG. 11
FIG. 12

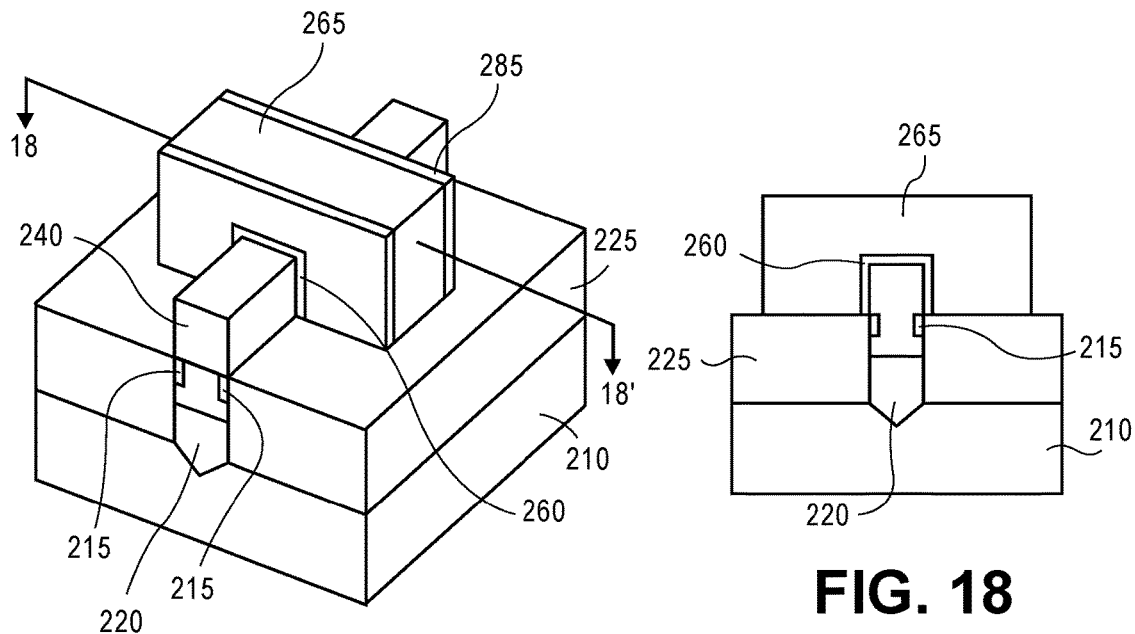
FIG. 17
FIG. 18
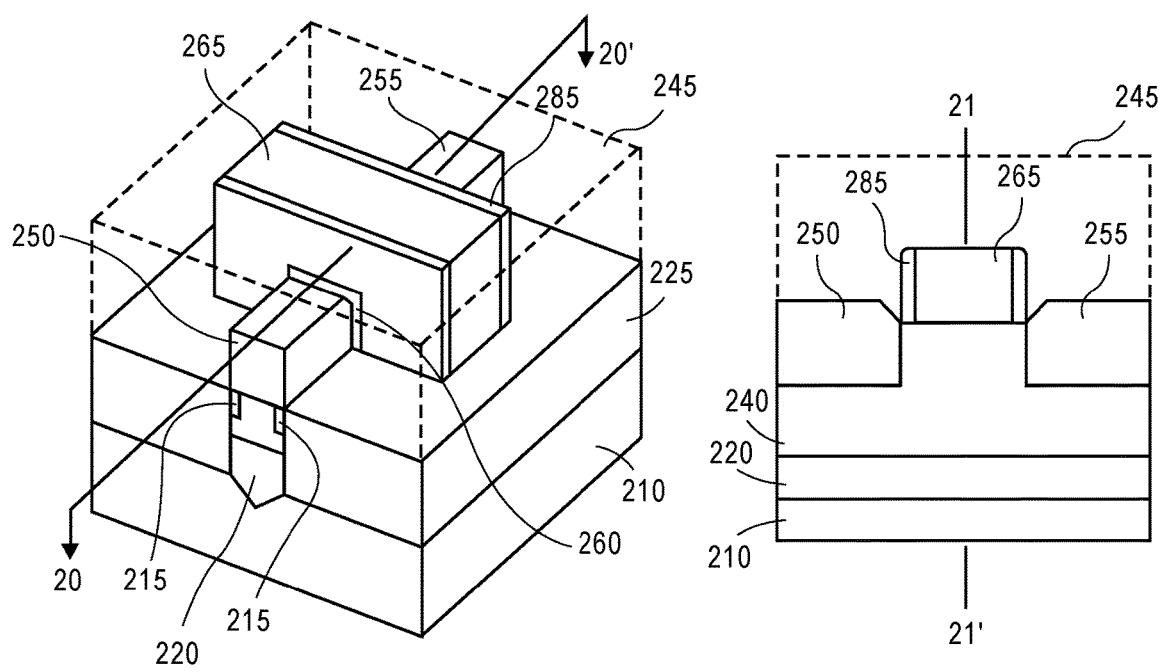
FIG. 19
FIG. 20

ART TRENCH SPACERS TO ENABLE FIN RELEASE FOR NON-LATTICE MATCHED CHANNELS

CROSS-REFERENCE TO RELATED APPLICATION

This patent application is a U.S. National Phase Application under 35 U.S.C. § 371 of International Application No. PCT/US2016/055028, filed Sep. 30, 2016, entitled "ART TRENCH SPACERS TO ENABLE FIN RELEASE FOR NON-LATTICE MATCHED CHANNELS," which designates the United States of America, the entire disclosure of which is hereby incorporated by reference in its entirety and for all purposes.

BACKGROUND

Field

Integrated circuit devices.

Description of Related Art

Power consumption is a major consideration in circuit development. When transistors are in their off state, the current draw through unintentional leakage paths of the transistors should preferably be minimized. A major leakage path in planar and FinFET transistors is in the sub-channel region (sometimes referred to as a "sub-fin" region in FinFETs or in general, "sub-structure"). To limit this path, designers of conventional transistors attempt to employ sharp positive/negative (p/n) junctions between the source and channel/sub-channel region and between the drain and channel/sub-channel region.

BRIEF DESCRIPTION OF THE DRAWINGS

FIG. 5 shows the structure of FIG. 4 following a removal of a portion of the sacrificial fin to form a trench and the lining of the trench with a spacer material.

FIG. 6 shows the structure of FIG. 5 through line 6-6'.

FIG. 7 shows the structure of FIG. 5 following the removal of a remaining portion of the sacrificial fin to form a trench of a controlled size and shape.

FIG. 8 shows the structure of FIG. 7 through line 8-8'.

FIG. 9 shows the structure of FIG. 7 following the introduction of a buffer material in the trench.

FIG. 10 shows the structure of FIG. 9 through line 10-10'.

FIG. 11 shows the structure of FIG. 9 following a removal of a portion of the buffer material in the trench to a level below the spacer layer.

FIG. 12 shows the structure of FIG. 11 through line 12-12'.

FIG. 17 shows the structure of FIG. 15 following the formation of a sacrificial or dummy gate stack on the fin.

FIG. 18 shows the structure of FIG. 17 through line 18-18'.

FIG. 19 shows the structure of FIG. 17 following the definition of junction regions and a deposition of a dielectric material on the structure.

FIG. 20 shows the structure of FIG. 19 through line 20-20'.

DETAILED DESCRIPTION

A technique to integrate low leakage non-lattice matched materials on an integrated circuit substrate is described. The technique enables removal of material below a transistor gate without a need for multiple material depositions selected for etch selectivities. An apparatus is also described that includes a transistor device including a channel disposed on a substrate between a source and a drain and a gate electrode disposed on the channel. The channel includes a channel material that is separated from a body of the same material on the substrate.

Figure 1:
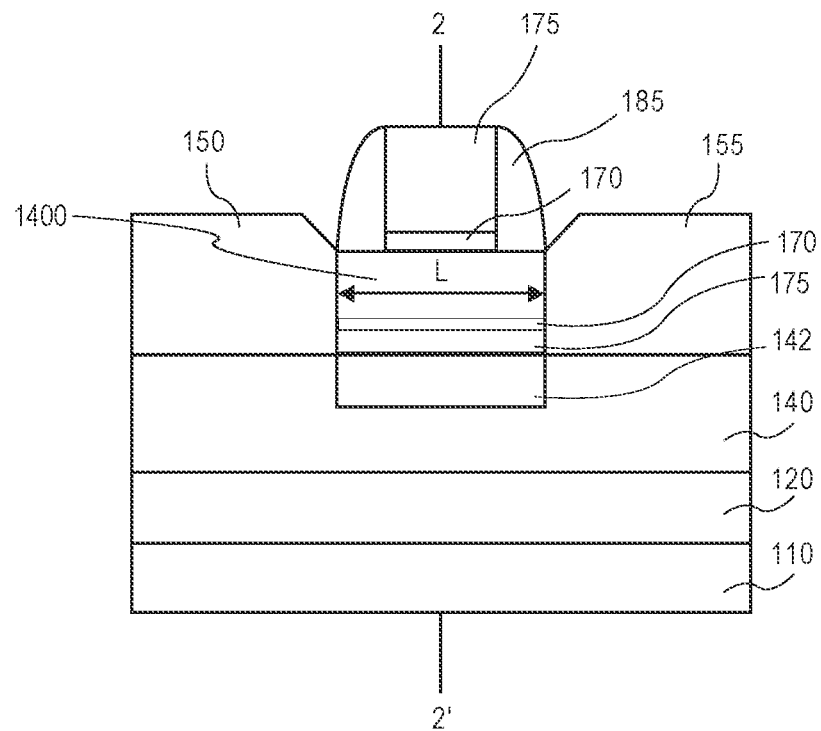
FIG. 1 shows a cross-sectional side view of an embodiment of a non-planar field effect transistor device.
Figure 2:
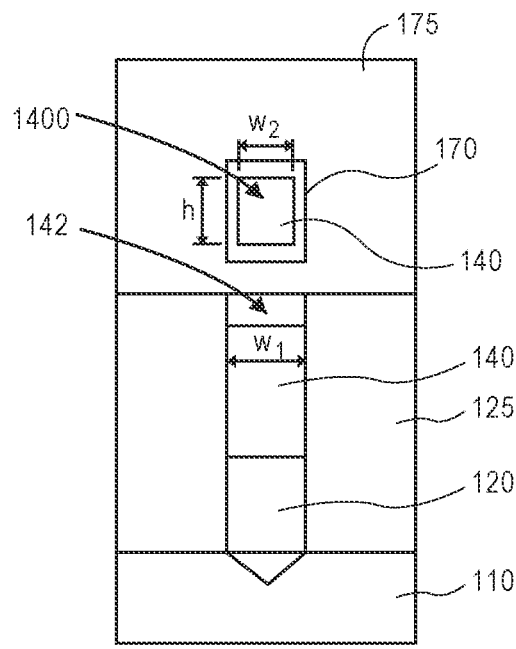
FIG. 2 shows a cross-sectional side view of the structure of FIG. 1 through line 2-2'.

FIG. 1 shows a cross-sectional side view of an embodiment of a field effect transistor (FET) device such as a metal oxide semiconductor field effect transistor (MOSFET) device, a tunneling field effect transistor (TFET) device or other FET device. FIG. 2 shows the structure of FIG. 1 through line 2-2'. In this embodiment, a non-planar transistor is described that includes a conducting channel above a level of a dielectric layer as part of a transistor body or fin. A gate electrode is disposed on adjacent sides of the transistor body or fin allowing multiple gates to operate on a single transistor. It is appreciated that the techniques described are applicable to other transistors including gate all-around devices.

Referring to FIG. 1 and FIG. 2, device 100 includes substrate 110 that is, for example, a single crystal silicon substrate such as a bulk substrate or a silicon on insulator substrate. Disposed on substrate 110, in this embodiment, is buffer or sub-fin layer 120. Buffer layer 120 contains, for example, a material that has a larger lattice than a material of the substrate (e.g., silicon substrate 110). A suitable material for buffer layer includes but is not limited to indium phosphate (InP), germanium (Ge), silicon germanium (SiGe), gallium arsenide (GaAs), gallium phosphide (GaP), gallium arsenide antimony (GaAsSb), indium aluminum arsenide (InAlAs), indium aluminum antimony (InAlSb), gallium antimony (GaSb), or other group III-V compound semiconductor. To reduce a threading dislocation density, a material in buffer layer 120 may be graded with, for example, a material of the underlying substrate (e.g., silicon) to gradually increase a material composition of buffer layer in an epitaxially grown film such that closer to substrate 110, a material concentration of buffer layer is less and increases away from the substrate. In another embodiment, two or more different materials may be present in buffer layer 120 such as a first material at the base of the buffer layer and a second material on the first material.

In the embodiment in FIGS. 1-2, disposed on buffer layer 120 is intrinsic layer 140. In one embodiment, intrinsic layer 140 is a channel material for the particular transistor device. In one embodiment, intrinsic layer 140 includes silicon, germanium, silicon germanium or a group III-V compound material. In one embodiment, the group III-V compound material includes indium (In) (i.e., has a concentration of indium). An example of a group III-V compound material including indium, particularly for an n-type transistor device is InGaAs. Germanium and silicon germanium are examples of material for intrinsic layer 140 for a p-type transistor device.

As illustrated in FIG. 1, disposed in intrinsic layer 140 is diffusion or junction region 150 and diffusion or junction region 155. In one embodiment, diffusion region 150 is a source of a MOSFET (e.g., an n$^+$ source) and diffusion region 155 is a drain of the MOSFET (e.g., n$^+$ drain). Disposed between diffusion regions 150 and 155 is channel 1400 of a material of intrinsic layer 140 (e.g., InGaAs) having a length dimension, L of, for example, 10-30 nm.

As illustrated in FIGS. 1 and 2, below the gate stack of the transistor device (below channel 1400) is a void. Void 142, in this embodiment, separates a portion of intrinsic layer 140. A portion of intrinsic layer 140 is operable to function as a channel of the transistor device. Channel 1400 of intrinsic layer 140 is separated from another portion of intrinsic layer 140 by void 142. In one aspect, void 142 minimizes device leakage below channel 1400.

As illustrated in FIG. 2, in one embodiment, intrinsic layer 140 below channel 1400 is a body having representative width dimension, $W_1$, defined by opposing sidewalls on the order of between 10 nm and 20 nm. Channel 1400 of intrinsic layer 140 has a width dimension, $W_2$, that is less than $W_1$. In one embodiment, a representative width, $W_2$, of channel 1400 is on the order of 5 nm to 10 nm. The reduced width, in one aspect, improves carrier control in the channel for a multi-gate device such as described because the reduced width means a distance between opposing sidewalls of a gate electrode that is disposed on channel 1400 are closer to one another. A representative height dimension, h, of channel 1400 is on the order of 10 nm to 100 nm.

FIG. 2 is a cross-section through a channel region of the transistor of FIG. 1 and shows that the body of intrinsic layer 140 in this region has a generally rectangular profile that, in one embodiment, has a superior surface that appears substantially parallel to a surface of substrate 110. It is appreciated that a profile of the body of intrinsic layer will depend in part on the processing techniques (e.g., polish, etching, etc.) used to form the body. Accordingly, a body targeted to have a rectangular profile may have a profile approximating a rectangular profile (e.g., a profile with rounded edges, a trapezoidal profile, etc.). The rectangular profile is prescribed for explanation purposes and is intended as but one example of a profile employed in a transistor device. Alternative profiles are also contemplated.

Overlying channel region 1400 is gate dielectric layer 170 of, for example, a silicon dioxide or a dielectric material having a dielectric constant greater than silicon dioxide (a high-k material) or a combination of silicon dioxide and a high-k and a thickness on the order of a few nanometers. As illustrated in FIG. 2, gate dielectric layer 170 is disposed on sidewalls of a length dimension, L, of the body of channel 1400 exposed above dielectric layer 125 and on a superior surface as viewed. In one embodiment, gate electric layer 170 also conforms to an inferior surface of a body of channel 1400. Disposed on gate dielectric 170 is gate electrode 175 of, for example, an electrically conductive material such as a metal material (e.g., tantalum), a metal nitride, or a silicide. In one embodiment, as shown in FIG. 2, gate electrode 175 wraps around (on all four sides) of channel 1400. For representative purposes, in one embodiment, gate electrode 175 has a total thickness on the order of 5-50 nm and dielectric layer 170 has a thickness of 1-15 nm.

Figure 3:
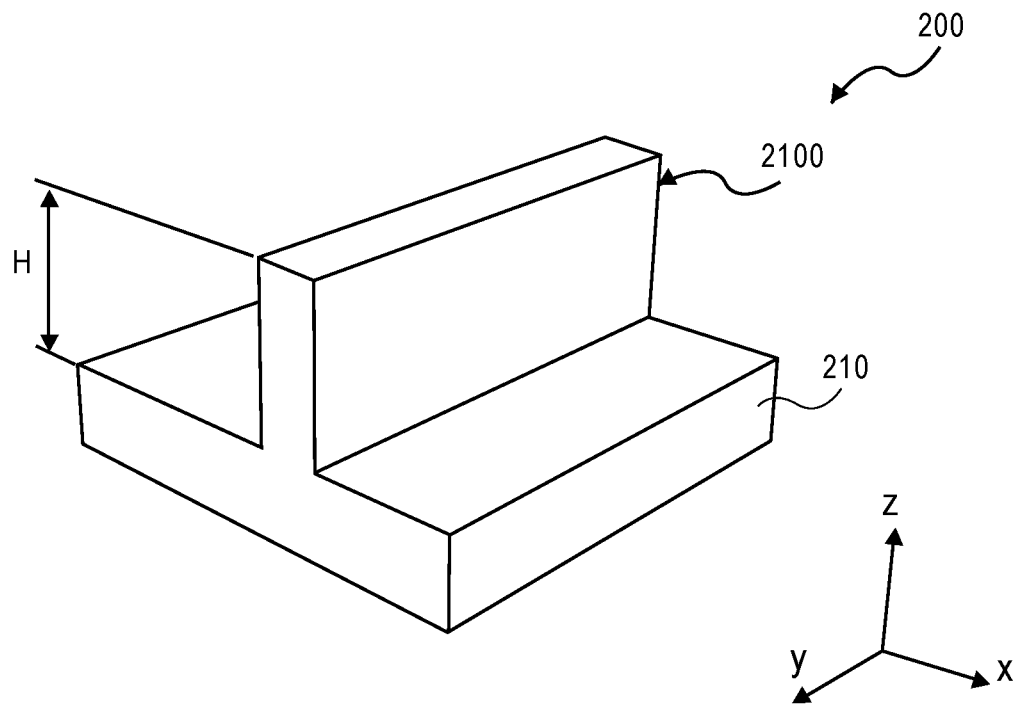
FIG. 3 shows a perspective side view of a substrate having a sacrificial fin formed therein.

FIGS. 3-23 describe a process of forming an FET device such as is illustrated in FIGS. 1-2. FIG. 24 presents a flow chart of the process. A formation process for an N-type FET is described. It should be appreciated that the techniques of forming a transistor presented herein are not limited to any particular device conductivity. Referring to FIG. 3 and with reference to the flow chart of FIG. 24, the process begins by defining sacrificial fin structures in a substrate material (block 310, FIG. 24). FIG. 3 shows a perspective side view of substrate 210 that may be any material that may serve as a foundation of which a multi-gate FET may be constructed. Representatively, substrate 210 is a portion of a larger substrate such as wafer. In one embodiment, substrate 210 is a semiconductor material such as single crystal silicon. Substrate 210 may be a bulk substrate or, in another embodiment, a silicon on insulator (SOI) structure. FIG. 3 shows substrate 210 following a patterning of the substrate to define sacrificial fin 2100. The sacrificial fin may one of many sacrificial fins formed across a wafer. Sacrificial fin 2100 may be formed by a mask and etch process wherein a mask (e.g., a hard mask) is introduced on a surface (superior surface) of substrate 210 to protect areas of the substrate where the sacrificial fins will be defined and to provide openings in non-fin areas. Once the mask is patterned, substrate 210 may be etched to remove material in unprotected areas. A substrate of silicon may be etched with a wet or dry etch. Representatively, a suitable etchant is HF based chemistry. Sacrificial fin 2100 is etched, in one embodiment, to have a height, H, on the order of 100-400 nm.

Figure 4:
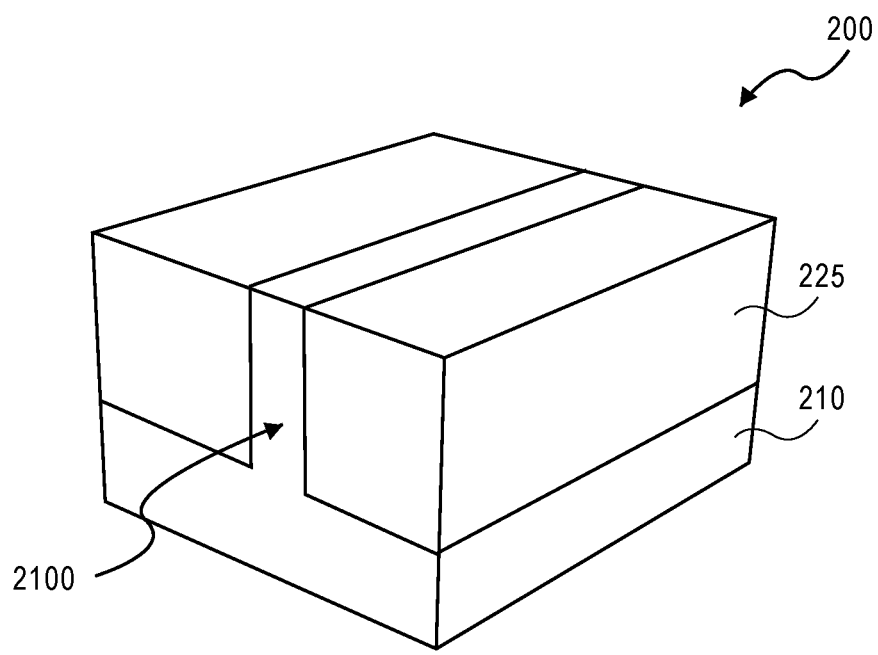
FIG. 4 shows the structure of FIG. 3 following a deposition of a trench dielectric layer on the substrate.

FIG. 4 shows the structure of FIG. 3 following a removal of the mask on the sacrificial fin and following the deposition of a trench dielectric layer on the substrate (block 320, FIG. 24). In one embodiment, dielectric layer 225 is silicon dioxide or a low-k dielectric material. Following deposition of dielectric layer 225, the surface (a superior surface as viewed) of the structure is polished to the level of the top of sacrificial fin 2100 so that the fin is exposed.

FIG. 5 shows the structure of FIG. 4 following the removal of a portion of sacrificial fin 2100 to form a portion of a trench of a controlled size and shape (block 330, FIG. 24). FIG. 6 shows the structure of FIG. 5 through line 6-6'. Referring to FIGS. 5 and 6, the sacrificial fin material may be removed by a mask and etch process wherein a mask is patterned on a surface of dielectric layer 225 leaving the sacrificial fin exposed followed by an etch process. A sacrificial fin of a silicon material may be etched by a dry or wet etch or a combination of the two. Suitable etchants for etching sacrificial fins of a silicon material include potassium hydroxide (KOH) and tetramethylammonium hydroxide (TMAH). The removal of a portion of the sacrificial fin forms trench 218. In one embodiment, approximately one-half of sacrificial fin 2100 is removed (one-half the height of sacrificial fin 2100).

FIGS. 5 and 6 also show the structure following a formation of a spacer layer or spacers along sidewalls of dielectric layer 225 in trench 218 (block 335, FIG. 24). In one embodiment, for a generally rectangular- or other quadrilateral-shaped trench, spacer layer 215 is formed on opposing sidewalls of dielectric layer 225 along a length, l, of the trench. In one embodiment, spacer layer is formed on sidewalls of dielectric layer 225 from a superior surface of sacrificial fin 2100 to a superior surface of dielectric layer 225 as viewed. Spacer layer 215 is deposited to a collective thickness to narrow a portion of trench 218 (minimize a width dimension) while leaving access or an opening to sacrificial fin 2100 below so that the remaining portion of sacrificial fin 2100 may subsequently be removed and replaced with a material or materials. For a trench having a width, $W_T$, on the order of 10 nm to 20 nm, spacer layer 215 has a width, $W_S$, on each of opposing sides of dielectric layer 225 on the order of 2 nm to 6 nm, with thickness of at least 5 nm or greater being limited to trenches having a width, $W_T$, greater than 10 nm. In one embodiment, a material for spacer layer 215 is a material that can be conformally deposited on sidewalls of dielectric layer 225 and can be selectively removed relative to a material of dielectric layer 225 and allow selective removal of sacrificial fin 2100 and other materials that might be added to trench 218 (e.g., buffer or sub-fin material). Where dielectric layer 225 is silicon dioxide, a material for spacer layer 215 may also be silicon dioxide (e.g., a doped silicon dioxide) or other material such as aluminum oxide ($Al_2O_3$), silicon nitride (SiN), silicon carbide (SiC), titanium oxide nitride ($TiO_xN$), silicon oxide nitride (SiON), hafnium oxide ($HfO_2$) or zirconium oxide ($ZrO_2$).

FIG. 7 shows the structure of FIG. 5 following a removal of the remaining portion of sacrificial fin 2100 (block 340, FIG. 24). FIG. 8 shows the structure of FIG. 7 through line 8-8'. In one embodiment, the remaining portion of sacrificial fin 2100 is removed by a mask and etch process. An etchant is selected that selectively etches sacrificial fin material relative to spacer layer 215 so that spacer layer 215 predominantly remains. The removal of the remaining portion of sacrificial fin 2100 increases a depth of trench 218. In one embodiment, the etching of sacrificial fin 2100 may be performed to provide a {111} faceting at the bottom of trench 218 to facilitate a growth of a group III-V compound material in the trench. Such faceting may be achieved using TMAH-like or any equivalent chemistry. Alternative geometries are also contemplated. The trench confined growth of materials offer an advantage of aspect ratio trapping (ART) whereby a crystalline quality of the epitaxial layer is enhanced through trapping of threading dislocations, stacking faults, twins, etc., at sidewalls of trench 218 where defects terminate such that overlying layers may be increasingly defect-free. In one embodiment, to achieve ART, trench 218 has dimensions such that its height, $h_t$, is on the order of twice its width, $w_t$.

FIG. 7 and FIG. 8 also show the structure following a reduction of a height of spacer layer 215 selective of dielectric layer 225 (block 345, FIG. 24). In one embodiment, spacer layer 215 is recessed from a superior surface of dielectric layer 225 as viewed (a top of trench 218) a distance, d, to a position below the superior surface. In one embodiment, a distance, d, from a superior surface of dielectric layer 225 to a superior surface of spacer layer 215 on each of opposing sidewalls of dielectric layer 225 is a height of a desired or targeted projection of a transistor body or fin as an intrinsic material (channel material) that will be formed in the region of trench 218 above spacer layer 215. In this embodiment, the region of trench 218 defined by a distance, d, provides a mold to control a shape of a channel material (e.g., as a transistor body or fin having a generally rectangular profile across its length). In another embodiment, spacer layer 215 may not be recessed and a formation of a channel material may be controlled through the addition and patterning of additional dielectric material on dielectric layer 225 or by controlling growth conditions of a channel material (e.g., controlling growth conditions so that lateral growth of channel material is constrained in favor of vertical growth). In the embodiment illustrated in FIG. 7 and FIG. 8, in one embodiment, a height of dielectric layer 225 may optimally be reduced prior to recessing spacer layer 215. Such reduction may be motivated by a desire to reduce an ultimate device height of a transistor. Representatively, a height of dielectric layer 225 of silicon dioxide may be reduced by a chemical mechanical polish (CMP).

FIG. 9 shows the structure of FIG. 7 following the introduction of a buffer or sub-fin material in trench 218 (block 350, FIG. 24). FIG. 10 shows the structure of FIG. 9 through line 10-10'. In one embodiment, buffer material 220 is a group III-V compound material such as, but not limited to, gallium arsenide (GaAs), indium phosphide (InP); germanium (Ge), gallium phosphide (GaP), gallium arsenide antimony (GaAsSb), indium aluminum arsenide (InAlAs) and gallium antimony (GaSb). In one embodiment, where an intrinsic or channel material subsequently introduced on buffer material 220 is InGaAs, buffer material 220 is GaAs as GaAs has relatively good etch selectively relative to InGaAs. Buffer material 220 may be introduced by an epitaxial growth process. In another embodiment, the trench may be filled with a first buffer of one of the noted materials followed by a second buffer of another of the noted materials. FIG. 9 shows buffer material 220 completely filling trench 218 on both sides of spacer layer 215. FIG. 9 and FIG. 10 show structure 200 following a planarization of a superior surface of the structure by, for example, a CMP to planarize buffer material 220 with a superior surface of dielectric layer 225.

FIG. 11 shows the structure of FIG. 9 following a removal of a portion of buffer material 220 in trench 218 (block 355, FIG. 24). FIG. 12 shows the structure of FIG. 11 through line 12-12'. Buffer material 220, in one embodiment, is recessed in trench 218 to a level below spacer layer 215 so spacer layer 215 is completely exposed in trench 218 both a superior surface and an underside surface (buffer material 220 does not contact spacer layer 215 after the recess of the buffer material). A wet or dry etch process may be utilized. A suitable etchant for etching a buffer material of GaAs is, for example, a two-step etchant process where the buffer material is first oxidized and, once oxidized, then removed. Suitable etchants include citric acid/peroxide, hydrochloric acid/peroxide, ozone and citric acid or ozone and hydrochloric acid.

Figure 13:
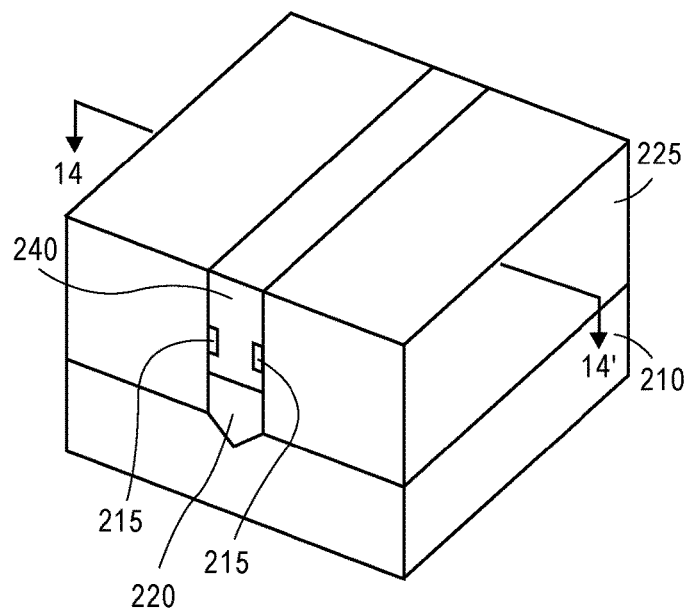
FIG. 13 shows the structure of FIG. 11 following the introduction of an intrinsic material into trench.
Figure 14:
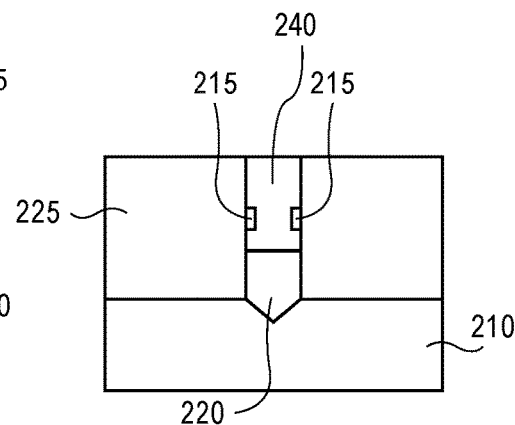
FIG. 14 shows the structure of FIG. 13 through line 14-14'.

FIG. 13 shows the structure of FIG. 12 following the introduction of an intrinsic material into trench 218 (block 360, FIG. 24). FIG. 14 shows the structure of FIG. 13 through line 14-14'. Intrinsic layer 240 is formed on buffer material 220. In this manner, intrinsic layer 240 is disposed in trench 218 on both sides of spacer layer 215. By recessing buffer material 220 to a level below spacer layer 215, intrinsic layer 240 has space to grow in the ART trench to terminate any defects. The intrinsic layer may be epitaxially grown. In one embodiment, intrinsic layer 240 is an indium-containing group III-V compound material that may be lightly doped n-type or p-type to the extent of, for example, 1E16 atoms per cubic centimeters. In one embodiment, intrinsic layer 240 is InGaAs. Intrinsic layer 240 has a representative height above a superior surface of spacer layer 215 on the order of 40 nm to 100 nm. FIGS. 13 and 14 show the structure following a polish of intrinsic layer 240 to a plane defined by dielectric layer 225. In another embodiment, intrinsic layer 240 may be grown or otherwise formed to extent beyond a superior surface of dielectric layer 225.

Figure 15:
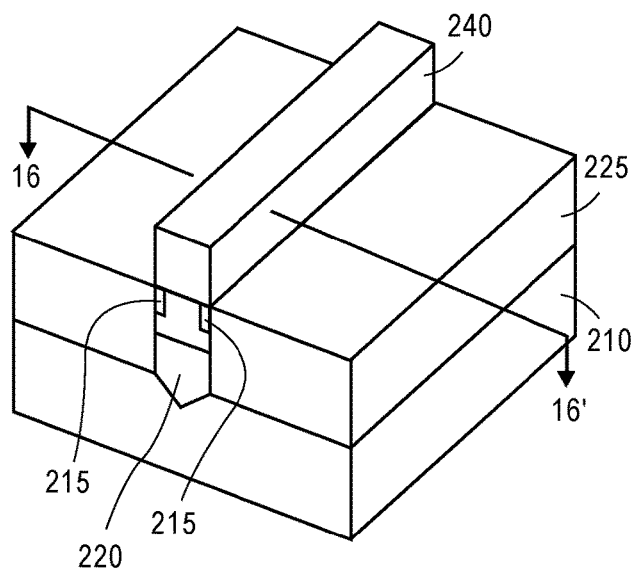
FIG. 15 shows the structure of FIG. 13 following a recession of the dielectric layer to define a transistor body or fin.
Figure 16:
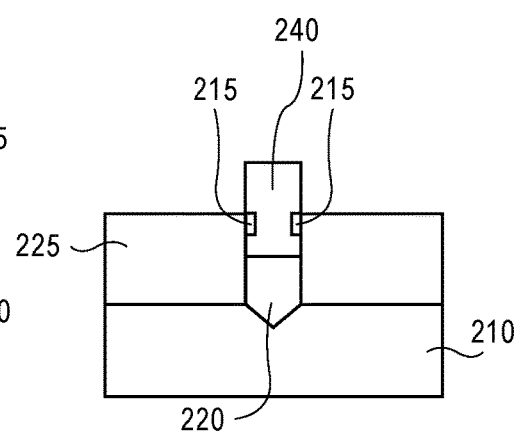
FIG. 16 shows the structure of FIG. 15 through line 16-16'.

FIG. 15 shows the structure of FIG. 13 following a recession of dielectric layer 225 to define a transistor body or fin (block 365, FIG. 24). FIG. 16 shows the structure of FIG. 15 through line 16-16'. In one embodiment, dielectric layer 225 is recessed depth defined by a height of spacer layer 215. Dielectric layer 225 may be recessed by a mask and etch process whereby a superior surface of intrinsic layer 240 is protected followed by an etch of dielectric layer 225.

FIG. 17 shows the structure of FIG. 15 following the formation of a sacrificial or dummy gate stack on the fin portion of intrinsic layer 240 extending above dielectric layer 225 (block 370, FIG. 24). FIG. 18 shows the structure of FIG. 17 through line 18-18'. In one embodiment, a gate stack includes gate dielectric layer 260 of, for example, silicon dioxide or a high-k dielectric material. Disposed on the gate dielectric layer, in one embodiment, is dummy gate 265 of, for example, polysilicon. In one embodiment, to form the gate stack, gate dielectric layer 260 and dummy gate 265 may each be introduced as a blanket deposition one over the other then patterned. Alternatively, a mask material may be introduced over the structure and patterned to have an opening for the dummy gate stack. The gate stack is then introduced in the opening in a conventional gate-last process. A spacer dielectric layer defining spacers 285 may be placed on opposite sides of the sacrificial gate by, for example, depositing a dielectric material such as silicon dioxide or a low-k dielectric material on structure 200 and patterning the dielectric material into spacers.

FIG. 19 shows the structure of FIG. 17 following the definition of junction regions (block 375, FIG. 24). FIG. 20 shows the structure of FIG. 19 through line 20-20'. FIGS. 19 and 20 show structure 200 including junction region or source 250 and junction region or drain 255. Representatively, the junction regions (source and drain) are defined, in one embodiment, of a material of intrinsic layer 240 (InGaAs) in designated source and drain regions on the opposite sides of the sacrificial or dummy gate 265 (block 380, FIG. 24). In another embodiment, the junction regions may be formed by doping of such fin portions. In a further embodiment, the junction regions may be formed by removing portions of the fin of intrinsic layer 240 in an etch undercut (EUC) process in regions corresponding to a source and a drain with the dummy gate stack and optional spacers 285 protecting a channel region of the fin. Following removal of fin material in source and drain regions to leave voids, source 250 and drain 255 are formed in respective voids. In one embodiment, a suitable material for an n-type transistor device is heavily n-type doped InGaAs or InAs or a combination of the two that may be epitaxially grown.

Following formation of junction regions (source 250/drain 255), a dielectric material may be introduced on the structure (on structure 200 (on a surface including the junction region and sacrificial gate 265)). In one embodiment, dielectric material 245 (shown in dashed lines) is an interlayer dielectric material (ILD0) such as silicon dioxide or a low-k material or a combination of materials (e.g., multiple low-k material of silicon dioxide and one or more low-k materials).

Figure 21:
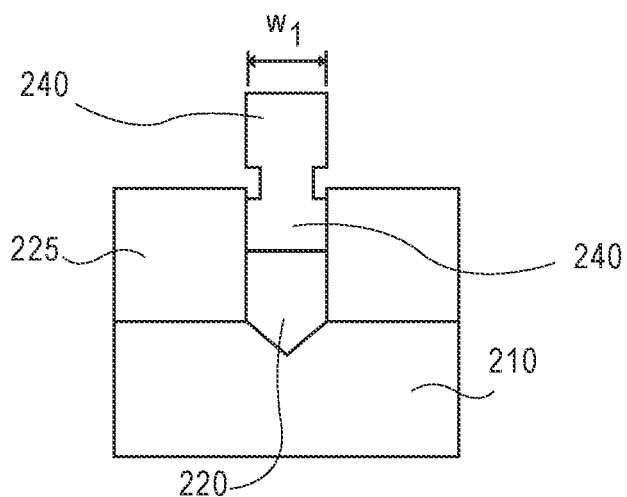
FIG. 21 shows the structure of FIG. 20 through line 21-21' following a removal of the sacrificial or dummy gate stack (gate dielectric 260 and dummy gate 265) and exposure of a channel region of intrinsic layer 240.

FIG. 21 shows the structure of FIG. 20 through line 21-21' following a removal of the sacrificial or dummy gate stack (gate dielectric 260 and dummy gate 265) and exposure of a channel region of intrinsic layer 240. The sacrificial gate stack may be removed by a mask and etch process. Representatively, a mask is formed on dielectric layer 245 having an open area over the dummy gate stack. An etch is then performed to remove the sacrificial gate stack leaving intrinsic layer 240 and a portion of a surface of dielectric layer 225 exposed. FIG. 21 also shows the structure following a recession of exposed dielectric layer 225 to expose spacer layer 215 and the removal of spacer layer 215 (block 385, FIG. 24). Dielectric layer 225 may be recessed and spacer layer 215 removed by a mask and etch process using, for example, the same mask that was patterned for the dummy gate stack removal. In one embodiment, the etch or etches are selective for dielectric layer 225 and spacer layer 215 relative to intrinsic layer 240 (the etch or etches removes dielectric layer 225 and spacer layer 215 without removing intrinsic layer 240).

Figure 22:
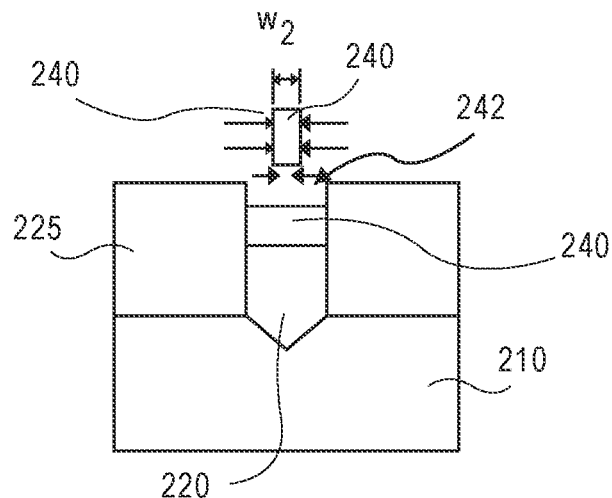
FIG. 22 shows the structure of FIG. 21 undergoing an etch to thin a width dimension of the fin (a width of intrinsic layer) in a channel region of the device and release the fin in the channel region from material in the trench.

FIG. 22 shows the structure of FIG. 21 undergoing an etch to thin a width dimension of the fin (intrinsic layer 240) in a channel region of the device and release the fin in the channel region from material (intrinsic layer 240) in the trench (block 390, FIG. 24). The thinning and releasing of the fin may be done with the same etchant 247. A suitable etchant for InGaAs is, for example, a two-step etchant process where the material is first oxidized and then the oxidized material removed. Suitable two-step etchants include citric acid and peroxide; hydrochloric acid and peroxide; ozone and citric acid; and ozone and hydrochloric acid. FIG. 22 shows the fin of intrinsic layer 240 having a width, $W_2$, that is less than a width, $W_1$, of the fin in FIG. 21. The fin is released at the portion of intrinsic layer 240 that was formed between spacer layer 215 (an intentionally narrow portion). Releasing the fin from material in the trench creates void 242 between a transistor channel and material below the channel. By creating void 242, a sub-channel leakage path is eliminated.

Figure 23:
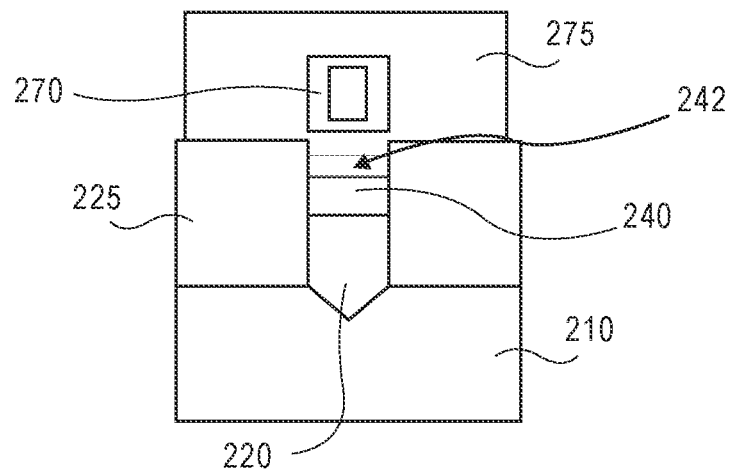
FIG. 23 shows the structure of FIG. 22 following the formation of a gate stack on the channel of the structure.
Figure 24:
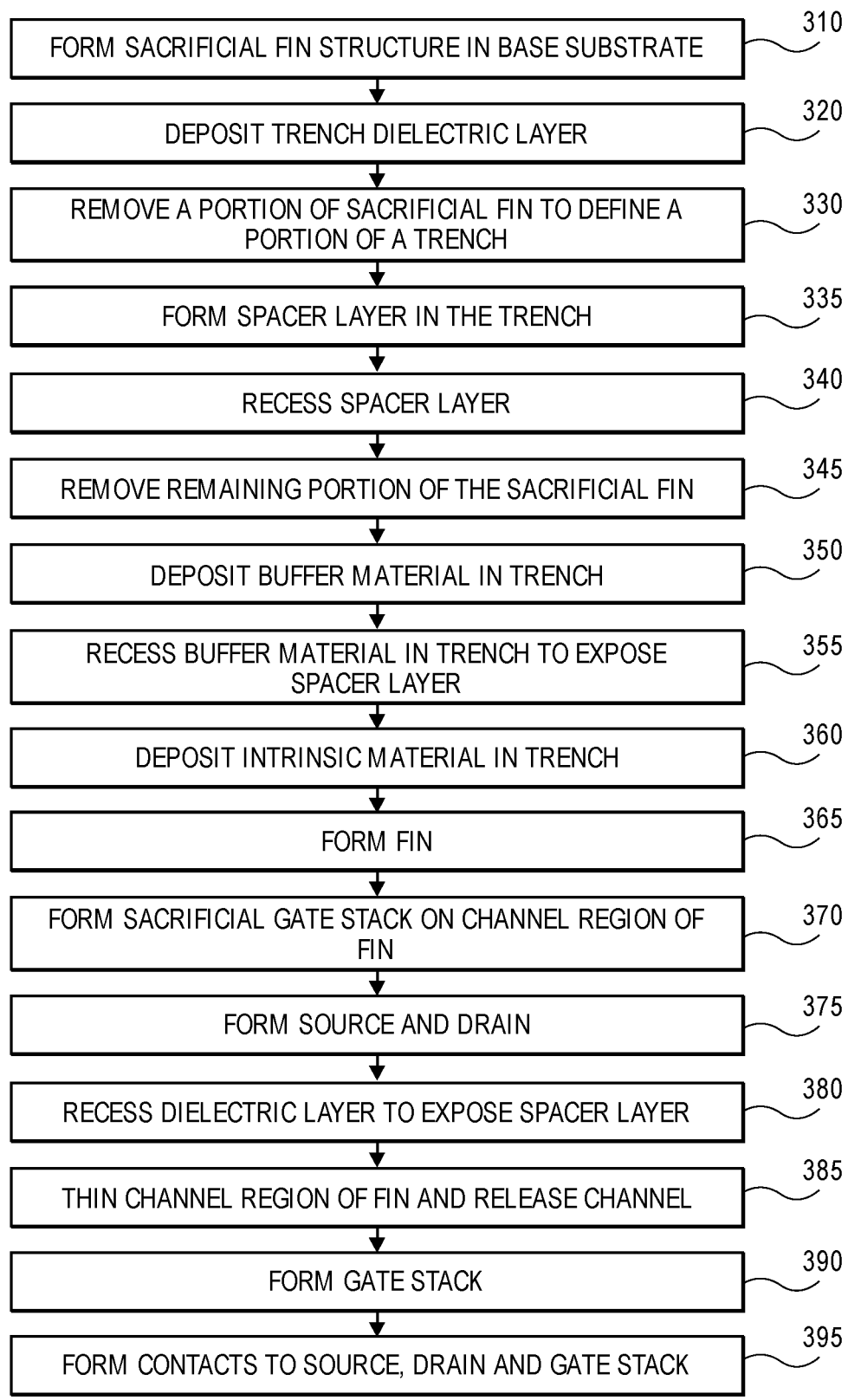
FIG. 24 shows a flow chart of the process described with reference to FIGS. 3-23.

FIG. 23 shows the structure of FIG. 22 following the formation of a gate stack on the channel of the structure (block 395, FIG. 24). A gate stack includes gate dielectric 270 and gate electrode 275. Suitable gate dielectric 270 is silicon dioxide or a high-k dielectric material or a combination of silicon dioxide and a high-k dielectric material. The presence of void 242 under the channel allows gate dielectric to optionally be formed on each side of the rectangular or otherwise quadrilateral-shaped or similar channel. FIG. 23 shows gate dielectric 270 on each side of the channel (on each of four sides). Gate electrode 275 is disposed on gate dielectric 270. Representative materials for a metal gate electrode include tungsten, tantalum, titanium or a nitride, a metal alloy, silicide or another material. The presence of void 242 under the channel also optionally allows gate electrode 275 to be formed on each side of the rectangular or otherwise quadrilateral-shaped or similar channel.

In the above embodiment, a channel material was formed on a buffer or sub-fin material in a trench. In another embodiment, a channel material may be formed in the trench without the need for the buffer or sub-fin material. As noted above, a trench having suitable dimensions (e.g., a height dimension twice a width dimensions) provides confined growth conditions including ART of defects at sidewalls of a trench and thereby improvement of a crystalline quality of a material at the top of the trench. Also, because the technique for releasing a channel material from a material in the trench does not rely on etch selectivities of different materials, different materials in a trench are not necessary. FIGS. 25-30 describe another embodiment of a process of forming an FET device. The process is similar to the process described with respect to FIGS. 3-24 except a buffer or sub-fin material is omitted and only a channel material is used in a trench fill process.

Figure 25:
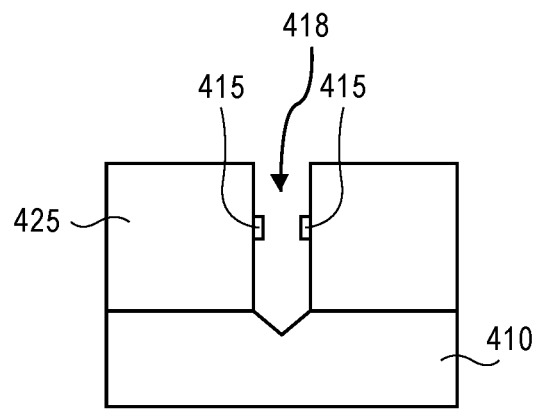
FIG. 25 shows a cross-sectional side view of a portion of an integrated circuit substrate following the formation of a trench in a dielectric layer and a spacer layer in the trench according to another embodiment.

FIG. 25 shows a cross-sectional side view of a portion of an integrated circuit substrate following the formation of a trench in a dielectric layer and a spacer layer in the trench. The method of forming the structure, in one embodiment, is similar to that described with reference to FIGS. 3-8. FIG. 25 shows substrate 410 of, for example, a silicon substrate; dielectric layer 425 formed on substrate 410; and trench 418 formed in dielectric layer 425. Spacer layer 415 is formed on opposing sidewalls of trench 418 and is recessed below a superior surface of the trench. It is appreciated that the recessed spacer layer is one embodiment and, in another embodiment, the spacer layer may extend to a superior surface of trench 418.

Figure 26:
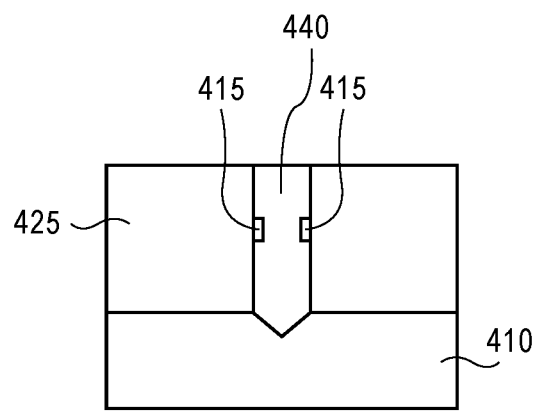
FIG. 26 shows the structure of FIG. 25 following the formation of an intrinsic layer of a channel material in the trench.

FIG. 26 shows the structure of FIG. 25 following the formation of intrinsic layer 440 of a channel material such as InGaAs in trench 418. As illustrated, intrinsic layer 440 is formed in the entire trench, from a base to a superior surface and is thus on both sides of spacer layer 415. In one embodiment, intrinsic layer 440 of InGaAs may be epitaxially grown.

Figure 27:
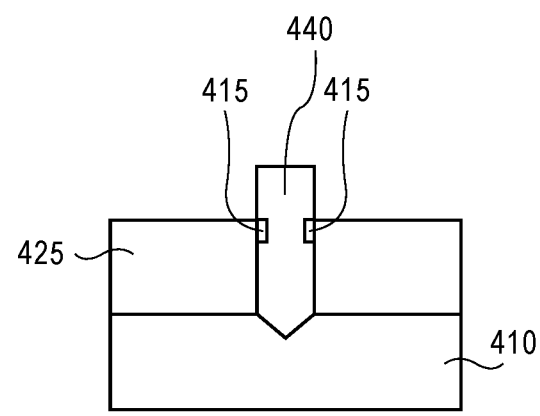
FIG. 27 shows the structure of FIG. 26 following a recession of the dielectric layer to expose a portion of the intrinsic layer as a transistor body or fin.

FIG. 27 shows the structure of FIG. 26 following a recession of dielectric layer 425 to expose a portion of intrinsic layer 440 as a transistor body or fin. In this embodiment, dielectric layer 425 is recessed to a level of spacer layer 415. Following the definition of a fin of intrinsic layer 440, a transistor formation process may follow the process of FIGS. 17-20 including forming of a sacrificial gate structure and a source and a drain in portions of the fin.

Figure 28:
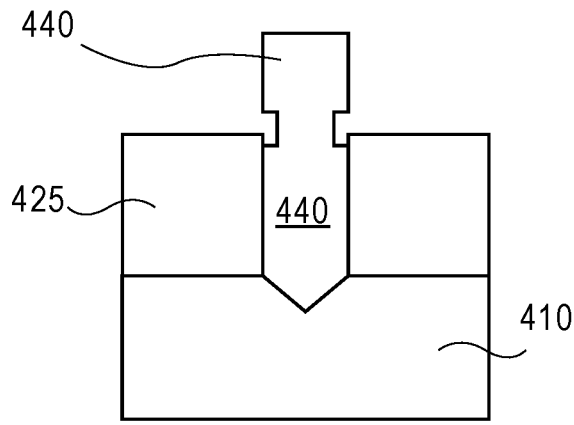
FIG. 28 shows the structure of FIG. 27 following a removal of a sacrificial or dummy gate stack (gate dielectric and dummy gate) and exposure of a channel region of the intrinsic layer and a removal of the spacer layer.

FIG. 28 shows the structure of FIG. 27 following a removal of the sacrificial or dummy gate stack (gate dielectric and dummy gate) and exposure of a channel region of intrinsic layer 440 and a removal of spacer layer 415. The sacrificial gate stack and spacer layer 415 may be removed by a mask and etch process. In one embodiment, the process is similar to that described with reference to FIG. 21.

Figure 29:
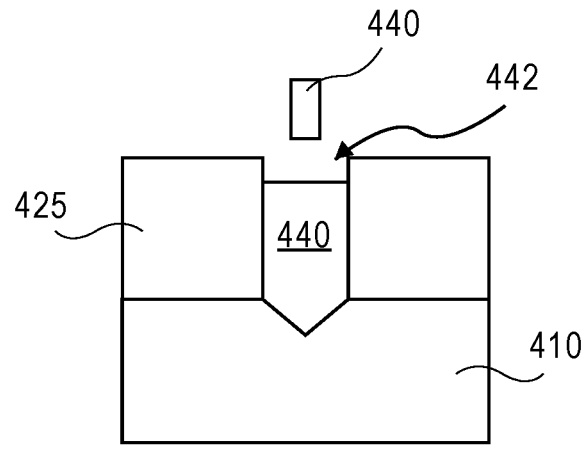
FIG. 29 shows the structure of FIG. 28 following an etch to thin a width dimension of the fin (intrinsic layer) in a channel region of the device and release the fin in the channel region from material (intrinsic layer) in the trench.

FIG. 29 shows the structure of FIG. 28 following an etch to thin a width dimension of the fin (intrinsic layer 440) in a channel region of the device and release the fin in the channel region from material (intrinsic layer 440) in the trench. The thinning and releasing of the fin may be done with the same etchant. In one embodiment, the process is similar to that described with reference to FIG. 22. The fin is released at the portion of intrinsic layer 440 that was formed between spacer layer 415 (an intentionally narrow portion). Releasing the fin from material in the trench creates void 442 between a transistor channel and material below the channel.

Figure 30:
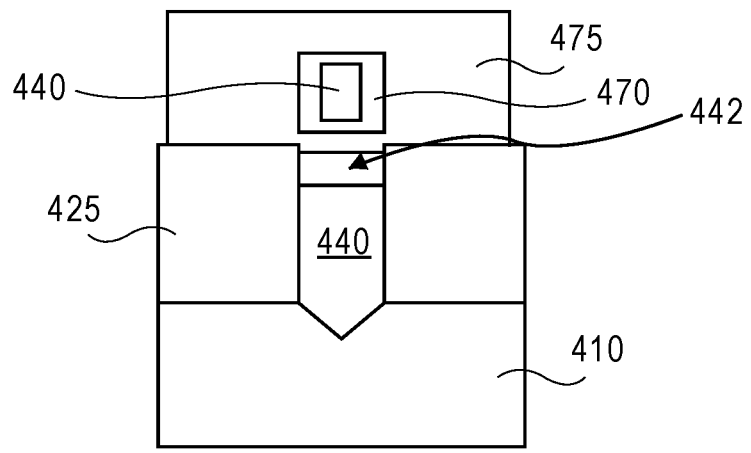
FIG. 30 shows the structure of FIG. 29 following the formation of a gate stack on the channel of the structure.

FIG. 30 shows the structure of FIG. 29 following the formation of a gate stack on the channel of the structure. A gate stack includes gate dielectric 470 and gate electrode 475. Suitable gate dielectric 470 is silicon dioxide or a high-k dielectric material or a combination of silicon dioxide and a high-k dielectric material. The presence of void 442 under the channel allows gate dielectric to optionally be formed on each side of the rectangular or otherwise quadrilateral-shaped or similar channel. FIG. 30 shows gate dielectric 470 on each side of the channel (on each of four sides). Gate electrode 475 is disposed on gate dielectric 470. Representative materials for a metal gate electrode include tungsten, tantalum, titanium or a nitride, a metal alloy, silicide or another material. The presence of void 442 under the channel also optionally allows gate electrode 475 to be formed on each side of the rectangular or otherwise quadrilateral-shaped or similar channel.

Figure 31:
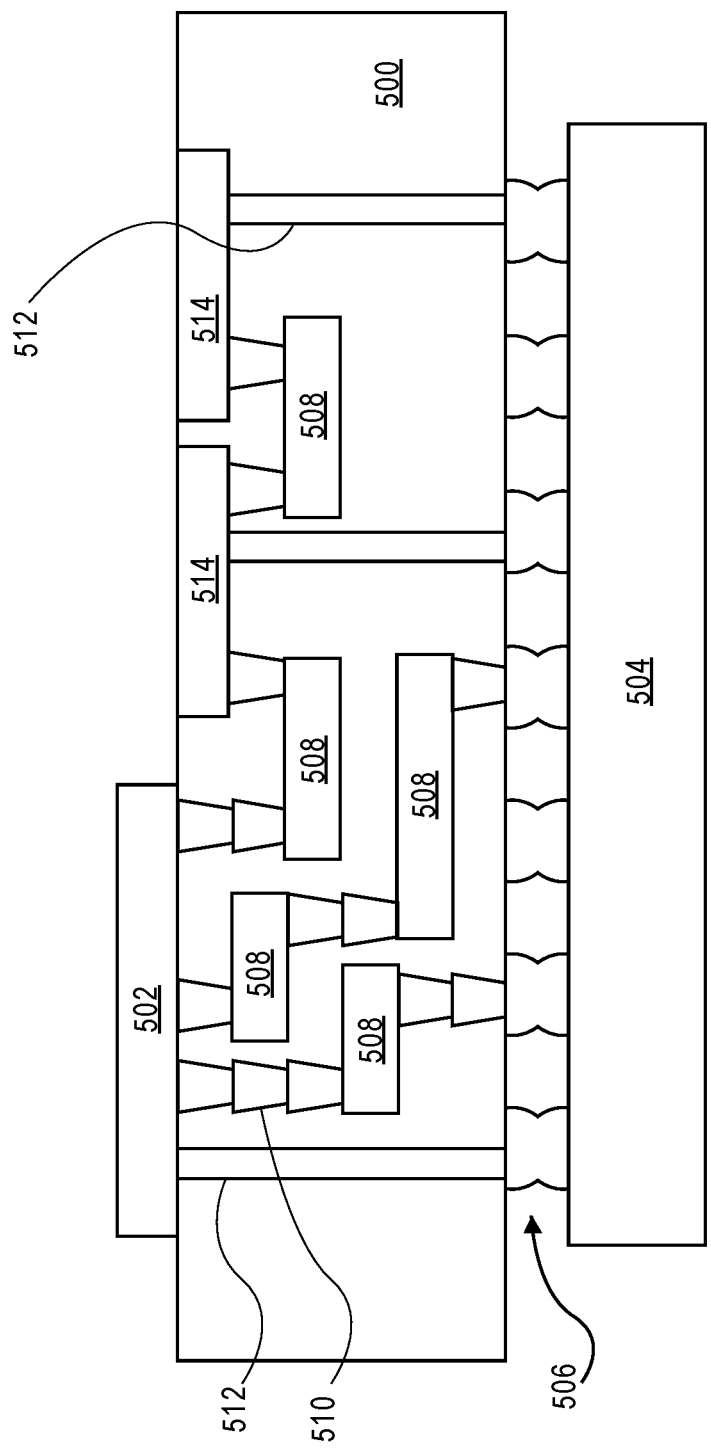
FIG. 31 is an interposer implementing one or more embodiments.

FIG. 31 illustrates interposer 500 that includes one or more embodiments. Interposer 500 is an intervening substrate used to bridge first substrate 502 to second substrate 504. First substrate 502 may be, for instance, an integrated circuit die including multigate transistor devices of the type described above. Second substrate 504 may be, for instance, a memory module, a computer motherboard, or another integrated circuit die. Generally, the purpose of interposer 500 is to spread a connection to a wider pitch or to reroute a connection to a different connection. For example, interposer 500 may connect an integrated circuit die to ball grid array (BGA) 506 that can subsequently be coupled to second substrate 504. In some embodiments, first and second substrates 502/504 are attached to opposing sides of interposer 500. In other embodiments, first and second substrates 502/504 are attached to the same side of interposer 500. In further embodiments, three or more substrates are interconnected by way of interposer 500.

Interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. Interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 500.

Figure 32:
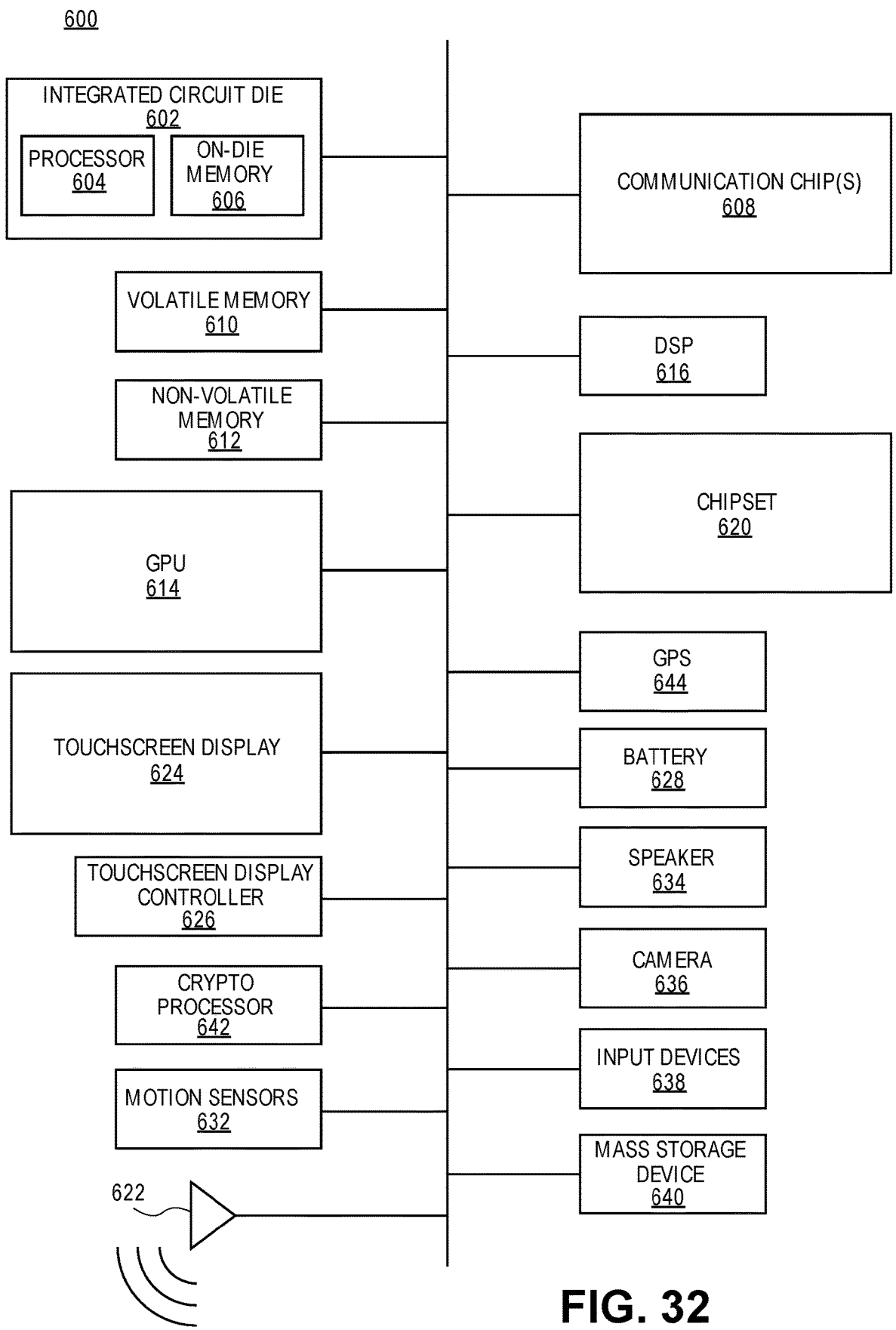
FIG. 32 illustrates an embodiment of a computing device.

FIG. 32 illustrates computing device 600 in accordance with one embodiment. Computing device 600 may include a number of components. In one embodiment, these components are attached to one or more motherboards. In an alternate embodiment, these components are fabricated onto a single system-on-a-chip (SoC) die rather than a motherboard. The components in computing device 600 include, but are not limited to, integrated circuit die 602 and at least one communication chip 608. In some implementations communication chip 608 is fabricated as part of integrated circuit die 602. Integrated circuit die 602 may include CPU 604 as well as on-die memory 606, often used as cache memory, that can be provided by technologies such as embedded DRAM (eDRAM) or spin-transfer torque memory (STTM or STTM-RAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), graphics processing unit 614 (GPU), digital signal processor 616, crypto processor 642 (a specialized processor that executes cryptographic algorithms within hardware), chipset 620, antenna 622, display or touchscreen display 624, touchscreen controller 626, battery 628 or other power source, a power amplifier (not shown), global positioning system (GPS) device 644, compass 630, motion coprocessor or sensors 632 (that may include an accelerometer, a gyroscope, and a compass), speaker 634, camera 636, user input devices 638 (such as a keyboard, mouse, stylus, and touchpad), and mass storage device 640 (such as hard disk drive, compact disk (CD), digital versatile disk (DVD), and so forth).

Communications chip 608 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 604 of computing device 600 includes one or more devices, such as multigate transistors, that are formed in accordance with embodiments described above. The term "processor" may refer to any device or portion of a device that processes electronic data from registers and/or memory to transform that electronic data into other electronic data that may be stored in registers and/or memory.

Communication chip 608 may also include one or more devices, such as transistors, that are formed in accordance with embodiments.

In further embodiments, another component housed within computing device 600 may contain one or more devices, such as multigate transistors, that are formed in accordance with implementations.

In various embodiments, computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

The following examples pertain to embodiments:

Example 1 is a transistor device including a transistor device including a channel disposed on a substrate between a source and a drain, a gate electrode disposed on the channel, wherein the channel includes a length dimension between the source and the drain wherein the channel includes a channel material that is separated from a body of the same material on a substrate.

In Example 2, a width dimension of the channel of the transistor device of Example 1 includes less than 10 nanometers.

In Example 3, the body of the transistor device of Example 1 or 2 includes the channel material formed on a buffer material.

In Example 4, the channel material of any of the transistor devices of Examples 1-3 includes a different lattice structure than a material of the substrate.

In Example 5, the channel material of any of the transistor devices of Examples 1-4 includes a group III-V compound semiconductor material.

In Example 6, the channel material of any of the transistor devices of Examples 1-4 includes germanium.

Example 7 is a method of forming a transistor device including forming a trench in a dielectric layer on an integrated circuit substrate, the trench including dimensions for a transistor body including a width; depositing a spacer layer in a portion of the trench, the spacer layer narrowing the width of the trench; forming a channel material in the trench through the spacer layer; recessing the dielectric layer to define a first portion of the channel material exposed and a second portion of the channel material in the trench; and separating the first portion of the channel material from the second portion of the channel material.

In Example 7, prior to forming the channel material in the trench, the method of Example 7 includes forming a buffer material in the trench and forming the channel material includes forming the channel material on the buffer material.

In Example 9, forming the buffer material of the method of Example 8 includes forming the buffer material below the spacer layer.

In Example 10, forming the buffer material below the spacer layer of the method of Example 9 includes forming the buffer material in the trench including through the spacer layer and then recessing the buffer material to a level below the spacer layer.

In Example 11, after recessing the dielectric layer, any of the methods of Examples 7-10 includes forming a source and a drain of a transistor on the transistor body, wherein the source and drain are separated by a channel region.

In Example 12, separating the first portion of the channel material from the second portion of channel material of any of the methods of Examples 7-10 includes separating in the channel region.

In Example 13, the method of any of Examples 7-12 further includes reducing a width of the first portion of the channel material.

In Example 14, the channel material of any of the methods of Examples 7-13 includes a different lattice structure than a material of the substrate.

Example 15 is a method of forming a transistor device including forming a sacrificial fin in a substrate, the sacrificial fin projecting a height dimension above a surface of the substrate; forming a dielectric material on opposite sides of the sacrificial fin; removing a first portion of the sacrificial fin to define a a first portion of a trench, wherein the first portion of the sacrificial fin is less than an entire portion of the sacrificial fin; depositing a spacer layer in the first portion of the trench, the spacer layer narrowing a width of the first portion of the trench; removing a second portion of the sacrificial fin to define a second portion of the trench; forming a channel material in the first portion and the second portion of the trench; recessing the dielectric layer to define a first portion of the channel material exposed and a second portion of the channel material in the second portion of the trench; and separating the first portion of the channel material from the second portion of the channel material.

In Example 16, prior to forming the channel material in the first portion and the second portion of the trench, the method of Example 15 includes forming a buffer material in the second portion of the trench and forming the channel material includes forming the channel material on the buffer material.

In Example 17, forming the buffer material in the second portion of the trench of the method of Example 16 includes forming the buffer material in the first portion of the trench and the second portion of the trench and then removing the buffer material from the first portion of the trench.

In Example 18, after recessing the dielectric layer, the methods of Example 15-17 includes forming a source and a drain of a transistor in regions of the channel material, wherein the source and drain are separated by a channel region.

In Example 19, separating the first portion of the channel material from the second portion of channel material of the method of Example 18 includes separating in the channel region.

In Example 20, the method of Example 19 further includes reducing a width of the first portion of the channel material in the channel region.

In Example 21, the channel material of any of the methods of Examples 15-20 includes a different lattice structure than a material of the substrate.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A transistor device comprising:
a channel disposed on a substrate between a source and a drain, a gate electrode disposed on the channel, wherein the channel comprises a length dimension between the source and the drain wherein the channel comprises a channel material that is separated from a body of the same material on the substrate, wherein the channel has a width dimension perpendicular to the length dimension, the width dimension of the channel less than a width of a top of the body of the same material.

2. The transistor device of claim 1, wherein a width dimension of the channel comprises less than 10 nanometers.

3. The transistor device of claim 1, wherein the body is on a buffer material.

4. The transistor device of claim 1, wherein the channel material comprises a different lattice structure than a material of the substrate.

5. The transistor device of claim 1, wherein the channel material comprises a group III-V compound semiconductor material.

6. The transistor device of claim 1, wherein the channel material comprises germanium.

7. A computing device, comprising:
a board; and
a component coupled to the board, the component including a transistor device, comprising:
a channel disposed on a substrate between a source and a drain, a gate electrode disposed on the channel, wherein the channel comprises a length dimension between the source and the drain wherein the channel comprises a channel material that is separated from a body of the same material on the substrate, wherein the channel has a width dimension perpendicular to the length dimension, the width dimension of the channel less than a width of a top of the body of the same material.

8. The computing device of claim 7, further comprising: a memory coupled to the board.

9. The computing device of claim 7, further comprising: a communication chip coupled to the board.

10. The computing device of claim 7, further comprising: a camera coupled to the board.

11. The computing device of claim 7, further comprising: a battery coupled to the board.

12. The computing device of claim 7, further comprising: a global positioning system (GPS) coupled to the board.

13. The computing device of claim 7, wherein the component is a packaged integrated circuit die.

* * * * *